United States Patent [19]

Festa

[11] 4,437,539

[45] Mar. 20, 1984

[54] SPEAKER ENCLOSURE

[76] Inventor: Lawrence M. Festa, 238 Cajon St., Laguna Beach, Calif. 92651

[21] Appl. No.: 429,540

[22] Filed: Sep. 30, 1982

[51] Int. Cl.$^3$ .............................................. H05K 5/00

[52] U.S. Cl. .................................... 181/145; 181/146; 181/156; 181/199

[58] Field of Search ............................... 181/144–147, 181/151, 156, 199; 179/1 E

[56] References Cited

U.S. PATENT DOCUMENTS 2,904,123 9/1959 Nigoo .................................. 181/145

4,213,008 7/1980 Helggrich ....................... 181/145 X

*Primary Examiner*—Benjamin R. Fuller

*Attorney, Agent, or Firm*—Francis X. LoJacono

[57] ABSTRACT

A speaker enclosure having a rear bass-reflex chamber and a forward mid-range chamber formed within a substantially rectangular housing. A tunnel-bass port is formed in the bottom section of the front wall of the enclosure, the bottom section being angularly disposed and arranged to communicate with the rear bass-reflex chamber. The upper section of the front wall is provided with a mid-range port that communicates with a mid-range chamber. A bass speaker is mounted to a central partition which divides and separates the bass and mid-range chambers. A sealed, self-contained, mid-range speaker is also mounted to the central partition and arranged to disperse mid-range tones by way of the mid-range chamber, so as to exit the mid-range port in unison with the high-frequency tones produced by a tweeter mounted to the upper front wall section. Thus, each speaker disperses its own frequency range in a clear and distinct manner.

7 Claims, 4 Drawing Figures

SPEAKER ENCLOSURE

BACKGROUND OF THE INVENTION

This invention relates to a speaker enclosure, and more particularly to a speaker enclosure which includes a novel bass-reflex chamber that provides an exceptionally low bass-frequency output heretofore found only in the higher priced speaker cabinets which require very expensive speaker systems.

As is well known in the art, various problems and difficulties are being encountered in providing speaker enclosures that include suitably tuned bass-reflex ports.

There are many types and variations of speaker enclosures presently on the market. Some of these are formed having special speakers wherein the enclosures are required to have single sealed chambers; and others have single bass-reflex chambers with one or more speakers mounted to the front walls of the chambers, and which are not in themselves separated from the bass speakers within the chambers.

Speaker enclosures can consist of two well-known types referred to as two-way or three-way systems—depending upon the number of speakers being employed therein. These types of speaker systems are normally provided with one or more small tunnel-port holes which allow the reflected bass tones to emanate through the front speaker wall. However, these enclosures have features that often restrict their use, or placement; and they are complicated in structure, and expensive to build and operate.

SUMMARY AND OBJECTS OF THE INVENTION

The present invention has for an important object to provide a novel speaker enclosure having a basic speaker system disposed therein in a unique manner, so as to establish a very high quality bass response. The speaker system includes a low-frequency or bass loudspeaker, a mid-range speaker, and a matching tweeter—each being isolated from the others.

Another object of the invention is to provide a speaker enclosure having a bass-reflex chamber positioned rearwardly of a forward mid-range chamber through which all mid-range tones pass before being projected into a given room or area. A tweeter is suitably located so as to disperse the high frequencies reproduced directly into the area as the low tones pass through a bottom bass port and the mid-range tones emanate from the forward chamber in unison.

Still another object of the invention is to provide a speaker enclosure that includes a tunnel port positioned at the lowermost portion of the bass-reflex chamber, the port being angled upwardly so as to establish the greatest amount of reflective transfer of the low tones captured within the bass-reflex chamber, this arrangement allowing for movement of large volumes of air in order to accomplish a high-quality performance.

A further object of the present invention is to provide a speaker enclosure of this type that can produce "clean" sounds at comfortable listening levels when driven by an amplifier with as little as 10 watts RMS. However, when coupled with a quality amplifier producing 65 watts RMS, the speaker system will reproduce excellent well-defined solid bass and crisp clear high sounds.

A still further object of the invention is to provide an enclosure of this character that processes the best sound-reproducing characteristics and gives optimum performance to any speaker, from the least expensive and less efficient speakers to the highest quality speakers, thus allowing each speaker to perform with greater output efficiency without restrictions or distortions.

Still a further object of the invention is to provide a speaker enclosure of this character that establishes distinctive frequency separation for each speaker range.

It is still a further object of the invention to provide a speaker enclosure of this character that is unlike most speaker cabinets in that it can be readily utilized as a piece of furniture, such as an end table.

Still another object of the invention is to provide a speaker enclosure with all of the above qualities that can be further relatively inexpensive to manufacture.

The characteristics and advantages of the invention are further sufficiently referred to in connection with the accompanying drawings, which represent one embodiment. After considering this example, skilled persons will understand that variations may be made without departing from the principles disclosed; and I contemplate the employment of any structures, arrangements or modes of operation that are properly within the scope of the appended claims.

BRIEF DESCRIPTION OF THE DRAWINGS

Referring more particularly to the accompanying drawings, which are for illustrative purposes only.

DESCRIPTION OF THE PREFERRED EMBODIMENT

Figure 1:
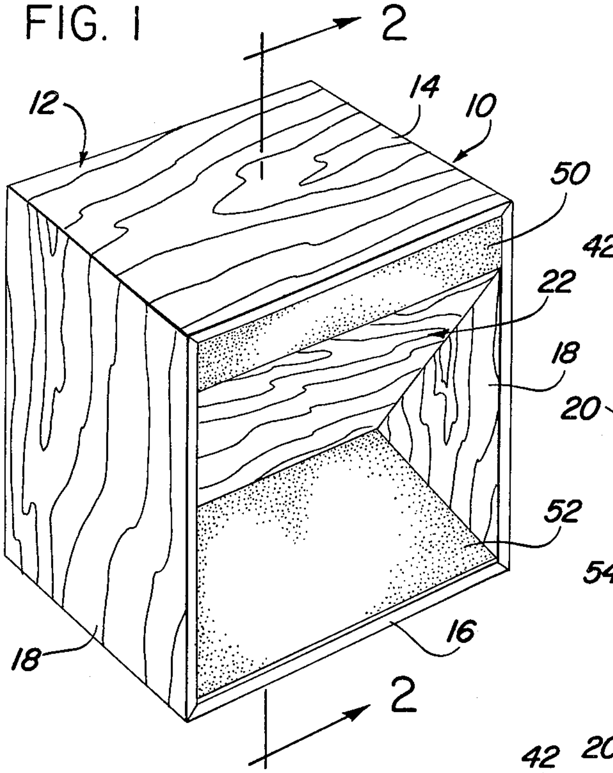
FIG. 1 is a perspective view of the new speaker enclosure.
Figure 2:
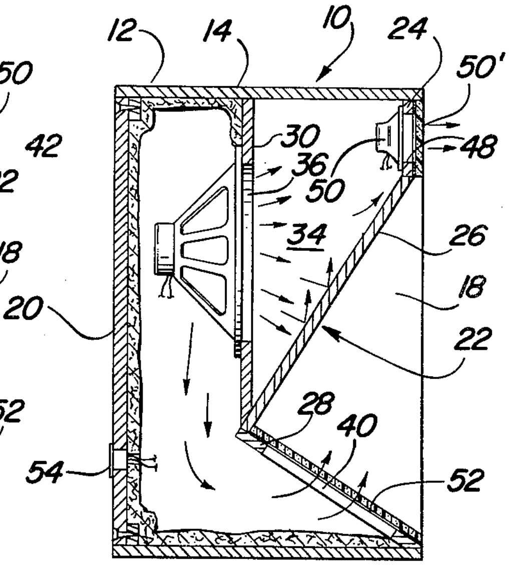
FIG. 2 is a cross-sectional view of the speaker enclosure taken substantially along line 2—2 of FIG. 1 illustrating the two basic chambers and the location of the bass-reflex port.
Figure 3:
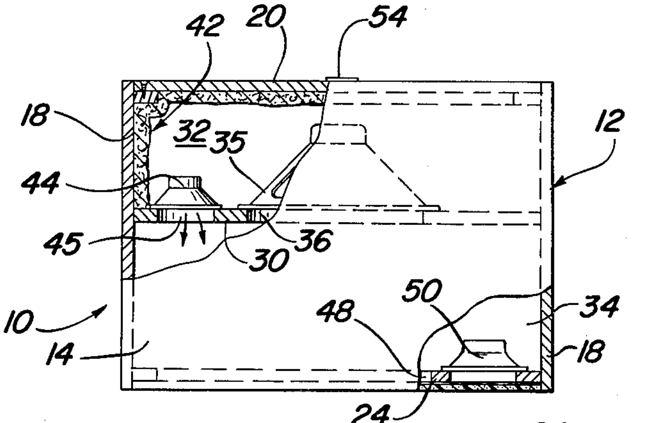
FIG. 3 is a top-plan view of the speaker enclosure with portions thereof broken away to show the various positions of the speakers.
Figure 4:
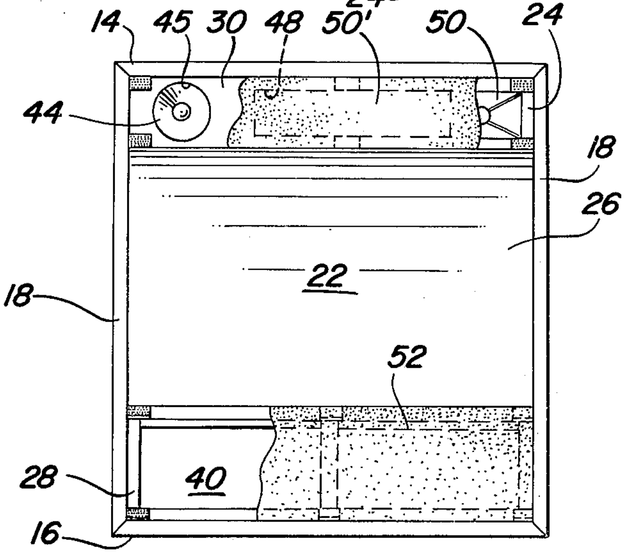
FIG. 4 is a front-elevational view with portions thereof broken away.

Referring more particularly to the drawing, there is shown a speaker enclosure (generally indicated at 10) having a substantially rectangular configuration, which can be provided with various dimensional arrangements. However, the preferred configuration of the enclosure housing 12 would have the approximate dimensions of 24 inches in height, 16 inches in depth, and 24 inches in width. These dimensions provide the most suitable box-like housing wherein two specifically arranged chambers are formed.

Accordingly, the housing 12 comprises a top wall 14, bottom wall 16, opposite side walls 18, and rear wall 20. The front wall (indicated generally at 22) is defined by three sections comprising a vertically disposed transverse member 24 attached to the underside of top wall 14 and the two side walls 18, an intermediate section 26 positioned angularly inward to a predetermined length, and a bottom member 28 positioned angularly outward from the terminating end of the intermediate member 26. Intermediate member 26 and bottom member 28 form a somewhat "L" shaped configuration.

Mounted internally of the housing is a central partition 30 which will also be referred to as a bass-reflex baffle. Partition 30 is positioned in a vertical alignment with rear wall 20, and extends from top wall 14 downwardly to the approximate intersection of front wall sections 26 and 28. Thus, two distinct chambers are formed—the first chamber being referred to as the rearward bass-reflex chamber 32, and the second chamber 34 being referred to as the forward mid-range chamber. This arrangement effects the sealing of the bass-reflex chamber from the forward mid-range chamber.

The rear bass-reflex chamber 32 is defined by portions of the two oppositely disposed side walls 18, rear wall 20, top and bottom walls 14 and 16 respectively, partition 30, and lower front wall section 28. It is important to note that the lower front wall section 28 further defines a bass-reflex port through which the bass tones are dispersed.

A bass loudspeaker 35 is mounted to partition 30 and is positioned over opening 36, thereby sealing the low tones within rear chamber 32. Thus, the captured low tones are pumped from the chamber and out of the tunnel-bass port 40 formed in the lower front wall section 28.

Also mounted within rear chamber 32 is a dampening means 42 consisting of any known suitable insulation material. The material is attached to the exposed wall surfaces of the chamber.

The mid-range chamber 34 is defined by the oppositely disposed walls 18, top wall 14, central partition 30, and the upper and intermediate front wall sections 24 and 26 respectively.

A self-enclosed-type mid-range speaker 44 is mounted over opening 45 formed in the upper left corner of partition 30. Such a self-enclosed speaker 44 allows its mid-range tones to be dispersed forwardly only into chamber 34 along with additional mid-range tones coming from speaker 35. Thus, the mid-range sounds from speaker 35 reflect against the angularly displaced wall member 26, directing the sounds upwardly so as to exit through the mid-range port 48 disposed in member 24, along with the mid-range sounds dispersed by speaker 44.

As the mid-range tones are discharged through port 48, the high-frequency range is produced by a special speaker 50, referred to as a tweeter. Tweeter 50 is mounted to the upper section member 24 of the front wall, whereby the high-frequency notes or tones are dispersed directly outward from the front of the enclosure, the tweeter 50 being sealed so as to prevent any emanating sound from entering into chamber 34. Tweeters are known for their unidirectional sound.

Thus, the positioning of the three speakers relative to each other, and relative to the bass and mid-range chambers and their associated parts, is essential to accomplish the total unique output of the reproduced sound.

Both the upper mid-range port 48 and the lower bass reflex port 40 are adapted to be covered with interchangeable acoustic foam covers 50' and 52 respectively.

It also should be noted that an outlet connector 54 is adapted to be mounted in rear wall 20.

The invention and its attendant advantages will be understood from the foregoing description; and it will be apparent that various changes may be made in the form, construction and arrangement of the parts of the invention without departing from the spirit and scope thereof or sacrificing its material advantates, the arrangement hereinbefore described being merely by way of example; and I do not wish to be restricted to the specific form shown or uses mentioned, except as defined in the accompanying claims.

I claim:

1. A speaker enclosure adapted for use with a speaker system including a bass speaker, a mid-range speaker, and a tweeter, said speaker enclosure comprising:

a housing having oppositely disposed side walls, top and bottom walls, a rear wall, and a front wall;

said front wall being formed having a plurality of sections, including at least an upper section and a lower section, which are angularly disposed relative to each other;

a bass-reflex port formed in said lower section;

a mid-range port formed in said upper section;

an intermediate partition positioned within said housing;

said intermediate partition defining a rear bass-reflex chamber in which said bass speaker is mounted, whereby low bass-frequency tones from said bass speaker are transmitted through said bass-reflex port which communicates with said bass-reflex chamber; and a forward mid-range chamber, said mid-range speaker being mounted to said intermediate partition, whereby mid-range-frequency tones are transmitted into said mid-range chamber and through said communicating mid-range port;

said tweeter being mounted to said front wall so as to emit high-frequency tones outwardly from said enclosure.

2. A speaker enclosure as recited in claim 1, wherein said upper section of said front wall is inclined downwardly and inwardly from said housing, and said lower section thereof is inclined downwardly and outwardly from the terminating end of said upper section, whereby said bass-reflex port in said lower section is angularly positioned to allow said low-frequency tones to exit therethrough in an upwardly and outwardly direction from said housing.

3. A speaker enclosure as recited in claim 2, wherein said upper section of said front wall includes a vertically disposed transverse member in which said mid-range port is disposed and in which said tweeter is mounted, said tweeter being located forwardly from said mid-range speaker.

4. A speaker enclosure as recited in claim 3, wherein said intermediate partition includes a centrally positioned opening over which said bass speaker is mounted and a second opening over which said mid-range speaker is mounted, said mid-range speaker being a self-contained sealed unit whereby sound therefrom does not enter said bass-reflex chamber.

5. A speaker enclosure as recited in claim 4, wherein said mid-range speaker is aligned with said mid-range port.

6. A speaker enclosure as recited in claim 5, wherein said enclosure includes removable cover members mounted over said respective bass and mid-range ports.

7. A speaker enclosure as recited in claim 4, wherein said upper and lower sections of said front wall are connected to define a substantially "L"-shaped configuration.

* * * * *